United States Patent [19]

Wrench, Jr. et al.

[11] 4,161,783

[45] Jul. 17, 1979

[54] CHARGE-COUPLED MULTIPLYING DIGITAL-TO-ANALOG CONVERTER

[75] Inventors: Edwin H. Wrench, Jr., San Diego, Calif.; Jerome J. Tiemann, Schenectady, N.Y.

[73] Assignee: The United States of America as represented by the Secretary of the Navy, Washington, D.C.

[21] Appl. No.: 892,580

[22] Filed: Apr. 3, 1978

[51] Int. Cl.$^2$ .......................... G06J 1/00; H03K 13/02
[52] U.S. Cl. .............................. 364/606; 307/221 D; 340/347 DA; 340/347 M; 357/24; 364/862
[58] Field of Search ............... 364/844, 842, 600, 602, 364/606, 862; 307/221 D; 340/347 DA, 347 MS File; 357/24

[56] References Cited

U.S. PATENT DOCUMENTS

| | | | |
|---|---|---|---|
| 3,956,624 | 5/1976 | Audaire et al. ................ | 364/862 X |
| 4,032,767 | 6/1977 | Lagnado ........................ | 364/841 X |
| 4,052,606 | 10/1977 | Heller et al. .................... | 364/862 X |
| 4,084,256 | 4/1978 | Engeler et al. ................. | 364/862 |

*Primary Examiner*—Joseph F. Ruggiero

*Attorney, Agent, or Firm*—Richard S. Sciascia; Ervin F. Johnston; John Stan

[57] ABSTRACT

A charge-coupled device (CCD) multiplying digital-to-analog converter multiplies a bipolar analog signal, representing as a charge, by a digital word, and produces a four-quadrant analog product, also represented as a charge. An analog signal S is added to or subtracted from a bias, resulting in signals $S+B$ and $-S+B$, which are converted into corresponding positive charges, $Q_S+Q_B$ and $-Q_S+Q_B$, which are transferred into potential wells at $X_i$ and $Y_i$, respectively. A digital word may be represented as $b_1 b_2 b_3 \ldots b_N$, where N is the word length. The CCD converter comprises N parallel devices, each of which performs the function of multiplying the signal S by either 0 or $\frac{1}{2}^i$. A gate between $X_i$ and $Y_i$ is controlled by the binary bit $b_i$. Equilibration occurs or does not occur depending on whether $b_i$ equals $0=$ or 1. The charges left in $X_i$ and $Y_i$ are then transferred to two other potential wells, which have channel stops diffused into them. The charges in the outer portions in each well are dumped to ground, while the remaining charges in each of the N devices are summed in a common potential well, to form a product as a sum of terms.

1 Claim, 1 Drawing Figure

$X_i = b_i Q_S + Q_B$ $Y_i = -b_i Q_S + Q_B$ $D_i = a_i X_i + (1-a_i) Y_i = b_i Q_S (2a_i - 1) + Q_B$

Let $\gamma_i = 2a_i - 1 = \frac{1}{2^{N-i}}$ $i = 1, 2, \ldots, N-1; \gamma_N = -1$ $P = \sum_{i=1}^{N} D_i = NQ_B + \sum_{i=1}^{N-1} \left[ \frac{b_i}{2^{N-i}} - b_N \right] Q_S$

*Charge-Coupled Multiplying Digital-to-Analog Converter*

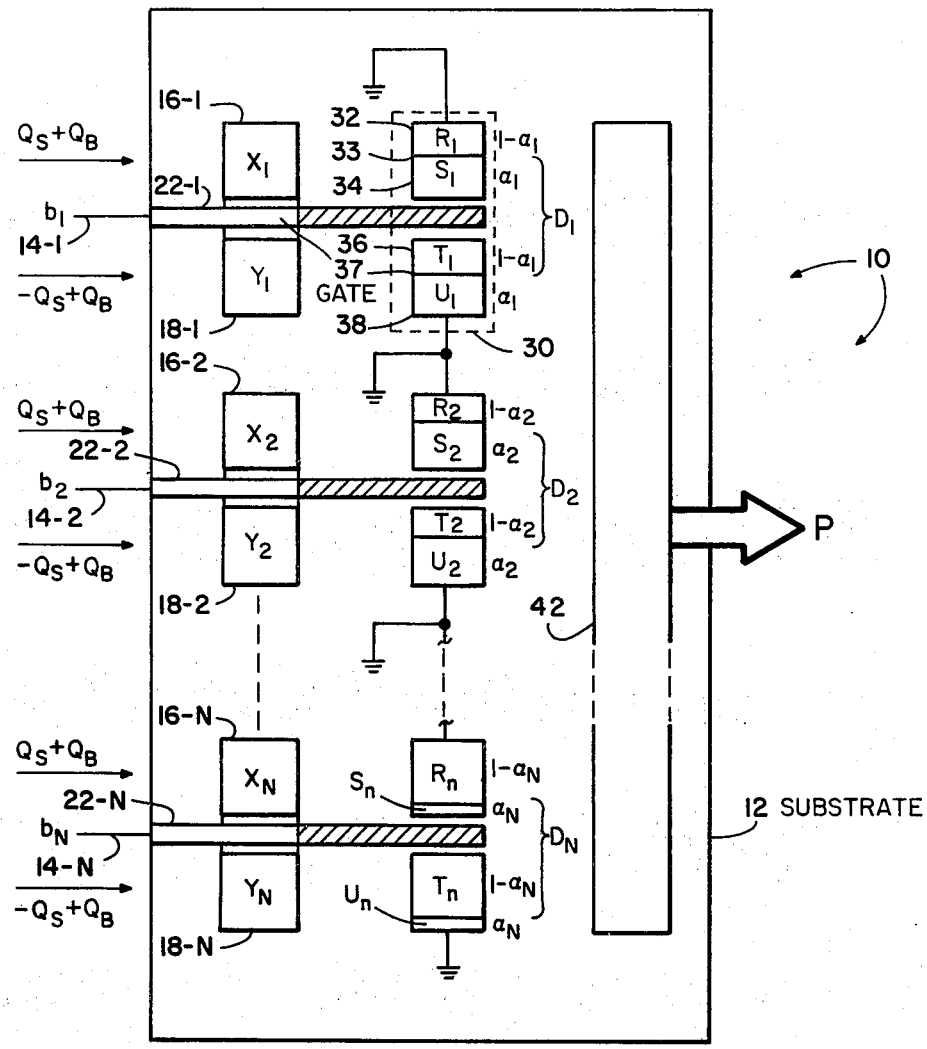
$$X_i = b_i Q_S + Q_B$$
$$Y_i = -b_i Q_S + Q_B$$
$$D_i = a_i X_i + (1-a_i)Y_i = b_i Q_S(2a_i - 1) + Q_B$$
Let $\gamma_i = 2a_i - 1 = \dfrac{1}{2^{N-i}}$
$i = 1, 2, \ldots, N-1;\ \gamma_N = -1$
$$P = \sum_{i=1}^{N} D_i = N Q_B + \sum_{i=1}^{N-1}\left[\dfrac{b_i}{2^{N-i}} - b_N\right] Q_S$$
*FIG: Charge-Coupled Multiplying Digital-to-Analog Converter*

CHARGE-COUPLED MULTIPLYING DIGITAL-TO-ANALOG CONVERTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The only known structure currently used for multiplying charge on a charge-coupled device and producing a product represented by a charge is a structure designed by Jerome J. Tiemann and W. E. Ehgeler of the General Electric Co., in Schenectady, New York. It has the limitation for many applications that the multiplication is fixed when the device is fabricated and cannot be changed. Therefore, the device is only useful when multiplication by a fixed reference is required, in contrast to the invention described herein.

Charge coupled semiconductor devices have been described in the prior art since at least April 1970. The basic principles of these devices are described by W. S. Boyle and G. E. Smith in the April 1970 issue of The Bell System Technical Journal of April 1970, in an article entitled Charge Coupled Semi-Conductor Devices. The physical parameters to build such devices as well as typical materials, for example a silicon-silicon dioxide MOS structure, are described therein. Additional information is furnished in the same issue of the Journal in an article entitled Experimental Verification of the Charge Coupled Device Concept, by G. F. Amelio, N. F. Tompsett and G. E. Smith.

SUMMARY OF THE INVENTION

A multiplying digital-to-analog converter comprises a substrate capable of being implemented with charge-coupled devices (CCD's) on its surface. Means are provided on the surface of the substrate, for receiving a digital word $b_1 b_2 b_3 \ldots b_N$, where N is the word length. Each means, which may be a metal tab or conductor on the surface, receives only one of the digits $b_i$, $1 \leq i \leq N$.

A first plurality of N potential wells, labeled $X_i$, receive a positive charge $Q_S + Q_B$, which results from the addition of the bipolar signal voltage S to a voltage bias B, $B > |S|$.

A second plurality of potential wells $Y_i$ in apposition to the potential wells $X_i$ receive a positive charge $-Q_S + Q_B$, which results from the subtraction of signal voltage S from the voltage bias B.

A plurality of N gates are implemented on the substrate between the potential wells $X_i$ and $Y_i$, for gating equilibrated charges which are in apposition, equilibration occurring only if the digit $b_i$ equals 0.

A plurality of N charge-coupled devices are implemented upon the substrate, which have channel stops diffused into them. They receive the equilibrated charges, the charge on one portion of the well being dumped to ground.

A larger potential well, implemented on the surface of the substrate, accepts the undumped charges from the last-named charge coupled devices and forms a product having the factors $Q_S$ and two's complement number $b_N b_{N-1} \ldots b_2 b_1$.

OBJECTS OF THE INVENTION

An object of the invention is to provide a charge-coupled multiplying digital-to-analog converter wherein the multiplication is done with charges rather than voltage so that it is directly compatible with CCD processing and can be done on a charge-transfer device.

Another object of the invention is to provide such a converter wherein the reference function is digital, thus allowing both multiplier inputs to vary.

These and other objects of the invention will become more readily apparent from the ensuing specification when taken together with the drawings.

BRIEF DESCRIPTION OF THE DRAWINGS

The FIGURE is a partially schematic and partially diagrammatic view of a charge-coupled multiplying digital-to-analog converter.

BRIEF DESCRIPTION OF THE PREFERRED EMBODIMENT

Referring to the FIGURE, therein is shown a multiplying digital-to-analog converter 10 comprising a substrate 12, capable of being implemented with charge-coupled devices (CCDs) on its surface. A first plurality of N means, 14-1 through 14-N, are disposed on the surface of the substrate 12. They receive a digital word $b_1 b_2 b_3 \ldots b_N$, where N is the word length, each means receiving only one of the digits $b_i$, $1 \leq i \leq N$.

A second plurality of N means, 16-1 through 16-N, are implemented on the substrate as potential wells $X_i$. These means receive a positive charge $Q_S + Q_B$, the charge resulting from the addition of a bipolar signal voltage S to a voltage bias B, $B > |S|$. Thus, $Q_S$ plus $Q_b$ is always positive.

A third plurality of N means, 18-1 through 18-N, are implemented on the substrate 12 as potential wells $Y_i$ in apposition to the potential wells $X_i$. These receive a positive charge $-Q_S + Q_b$, which results from the subtraction of the signal voltage S from the voltage bias B.

A fourth plurality of N means, 22-1 through 22-N, are implemented on the substrate 12 between the potential wells $X_i$, 16, and $Y_i$. The means 22 can equilibrate charges which are in apposition, equilibration occurring only if the digit $b_i$ equals 0.

A fifth plurality of N pairs of means 30, implemented on the substrate 12, have channel stops 33 and 37, diffused into them. The means 30 receives the equilibrated charges, the charge on one portion, 32 and 38, being dumped to ground.

Another means, a sixth means 42, is also implemented on the substrate 12 as a larger potential well. It accepts the undumped charges from the means 30, to form a product having the factors $Q_s$ and the two's complement number $b_N b_{N-1} \ldots b_2 b_1$.

Discussing now the theoretical background of the invention, the invention relates to a CCD structure that multiplies a bipolar analog signal S, represented as a charge, by a digital word, and produces a four-quadrant analog product, also represented as a charge. Although the signal S is bipolar, a bias B is added to it so that the resultant signals, $S + B$, and $-S + B$ are always of the same polarity.

With respect to the types of quadrant multipliers, multipliers are referred to as 1-, 2-, or 4-quadrant multipliers dependent upon the signal input. A 1-quadrant multiplier requires that both inputs be positive; a 2-quadrant multiplier requires that one signal input be positive, but the other may be either positive or negative; and a 4-quadrant multiplier may have either input positive or negative.

The multiplying D/A converter 10 comprises N parallel devices, each of which performs the function of multiplying the input signal by either zero or $\frac{1}{2}^i$, depending on whether $b_i$ is zero or 1. This multiplication is accomplished as follows. The charge $Q_S+Q_B$ is transferred into a potential well at $X_i$, designated 16, and $Y_i$, designated 18. If $b_i=1$, then no equilibration occurs. The charge left in $X_i$ and $Y_i$ is then $b_iQ_S+Q_B$ and $-b_iQ_S+Q_B$, respectively. The charges $X_i$ and $Y_i$ are then transferred into two other potential wells 30 that have channel stops, for example 33 and 37, diffused into them, with the dimensions in terms of $\alpha$ as shown in the FIGURE.

The charge in each part of the wells, assuming unit area is then $$R_i=(I-\alpha_i)X_i=(I-\alpha_i)(b_iQ_S+Q_B) \quad (1)$$

$$S_i=\alpha_iX_i=\alpha_i(b_iQ_S+Q_B) \quad (2)$$

$$T_i=(I-\alpha_i)Y_i=(I-\alpha_i)(-b_iQ_S+Q_B) \quad (3)$$

$$U_i=\alpha_iY_i=\alpha_i(-b_iQ_S+Q_B) \quad (4)$$

The charge in the outer portions, $R_i$ and $S_i$, of each well is then dumped to ground so that $R_i=U_i=0$. The various areas $R_i$, $S_i$, $T_i$ and $U_i$ are so proportioned that the product is obtained.

The remaining charge in each of the N devices is transferred into a common potential well 42 to form the sum, by use of Eqs. (2), (3) and (6):

$$P = \sum_{i=1}^{N} S_i + T_i = \sum_{i=1}^{N} b_iQ_S\gamma_i + Q_B \quad (5)$$

where $\lambda_i=2\alpha_{i-1}$. It will be noted that $Q_B$ is not a function of $\alpha$ or $\gamma$. From EQ. (6) it follows that $$\alpha_i = \frac{\gamma_i+1}{2} \quad (7)$$

The term $\alpha$ can take values from zero to one so $\gamma_i$ can be from minus one to plus one. By chosing the $\gamma$'s as $$\gamma_N = -1 \; \gamma_i = \frac{1}{2^{N-i}} \; i = 1, 2, \ldots, N-1 \quad (8)$$

the product formed is the signal $Q_S$ times a two's complement binary number, $b_{N-1} \ldots b_1$. An equivalent form of the product P is shown in the FIGURE.

Obviously, many modifications and variations of the present invention are possible in the light of the above teachings, and, it is therefore understood that within the scope of the disclosed inventive concept, the invention may be practiced otherwise than specifically described.

What is claimed is:

1. A multiplying digital-to-analog converter comprising:
    a substrate, capable of being implemented with charge-coupled devices (CCDs) on its surface;
    a first plurality of N means, disposed on the surface of the substrate, for receiving a digital word $b_1b_2b_3 \ldots b_N$, where N is the word length, each means receiving only one of the digits $b_i$, $1 \leq i \leq N$;
    a second plurality of N means, implemented on the substrate as potential wells $X_i$, for receiving a positive charge $Q_S+Q_B$, which results from the addition of a bipolar signal voltage S to a voltage bias B, $B \leq |S|$;
    a third plurality of N means, implemented on the substrate as potential wells $Y_i$ in apposition to the potential wells $X_i$, for receiving a positive charge $-Q_S+Q_B$, which results from the subtraction of the signal voltage S from the voltage bias B;
    a fourth plurality of N means, implemented on the substrate between the potential wells $X_i$ and $Y_i$, for gating equilibrated charges which are in apposition, equilibration occurring only if the digit $b_i$ equals 0;
    a fifth plurality of N pairs of means, implemented upon the substrate and having channel stops diffused into them, for receiving the equilibrated charges, the charge on one portion of each of the N pairs of wells being dumped to ground; and
    a sixth means implemented on the substrate as a larger potential well, which accepts the undumped charges from the fifth means, the means for receiving the equilibrated charges, for forming a product having the factors $Q_S$ and the two's complement number $b_Nb_{N-1} \ldots b_2b_1$.

* * * * *